(12) United States Patent
Yoshioka

(10) Patent No.: US 7,539,242 B2
(45) Date of Patent: May 26, 2009

(54) SEMICONDUCTOR INTEGRATED CIRCUIT DEVICE AND METHOD OF TESTING THE SAME

(75) Inventor: Shinichi Yoshioka, Asaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 605 days.

(21) Appl. No.: 10/798,403

(22) Filed: Mar. 12, 2004

(65) Prior Publication Data

US 2005/0047495 A1    Mar. 3, 2005

(30) Foreign Application Priority Data

Sep. 1, 2003    (JP) ............................ 2003-308947

(51) Int. Cl.
*H04B 1/38* (2006.01)

(52) U.S. Cl. .................. 375/219; 375/354; 455/73; 370/272; 370/297

(58) Field of Classification Search ................ 375/219, 375/221, 354; 455/73; 370/276, 297; 327/141
See application file for complete search history.

(56) References Cited

U.S. PATENT DOCUMENTS 5,742,798 A * 4/1998 Goldrian ..................... 713/400
7,098,685 B1 * 8/2006 Agrawal et al. ............... 326/38
7,099,278 B2 * 8/2006 Momtaz ..................... 370/249
2003/0179771 A1 * 9/2003 Chan et al. .................. 370/445
2003/0196139 A1 * 10/2003 Evans ......................... 714/25
2004/0228396 A1 * 11/2004 Wood, Jr. .................... 375/220

FOREIGN PATENT DOCUMENTS

JP    2002-9745    1/2002

OTHER PUBLICATIONS

Texas Instruments, description of TLK2501 1.5 to 2.5 GBPS Transceiver, revised Jul. 2003.

* cited by examiner

*Primary Examiner*—David C Payne
*Assistant Examiner*—Leon Flores
(74) *Attorney, Agent, or Firm*—Oblon, Spivak, McClelland, Maier & Neustadt, P.C.

(57) ABSTRACT

A semiconductor integrated circuit device has first and second receivers and first and second transmitters. The first receiver has a first clock data recovery (CDR) circuit, and the second receiver has a second CDR circuit. Each of these first and second CDR circuits receives serial data, recovers a clock from the received serial data, and changes the phase of the generated clock. The first transmitter has a first serializer (SER), and the second transmitter has a second SER. The first SER converts parallel data into serial data synchronized with a transmit clock or the clock generated by the first CDR circuit. The second SER converts parallel data into serial data synchronized with a transmit clock or the clock generated by the second CDR circuit.

19 Claims, 10 Drawing Sheets

High-speed serial data interface

Normal operation

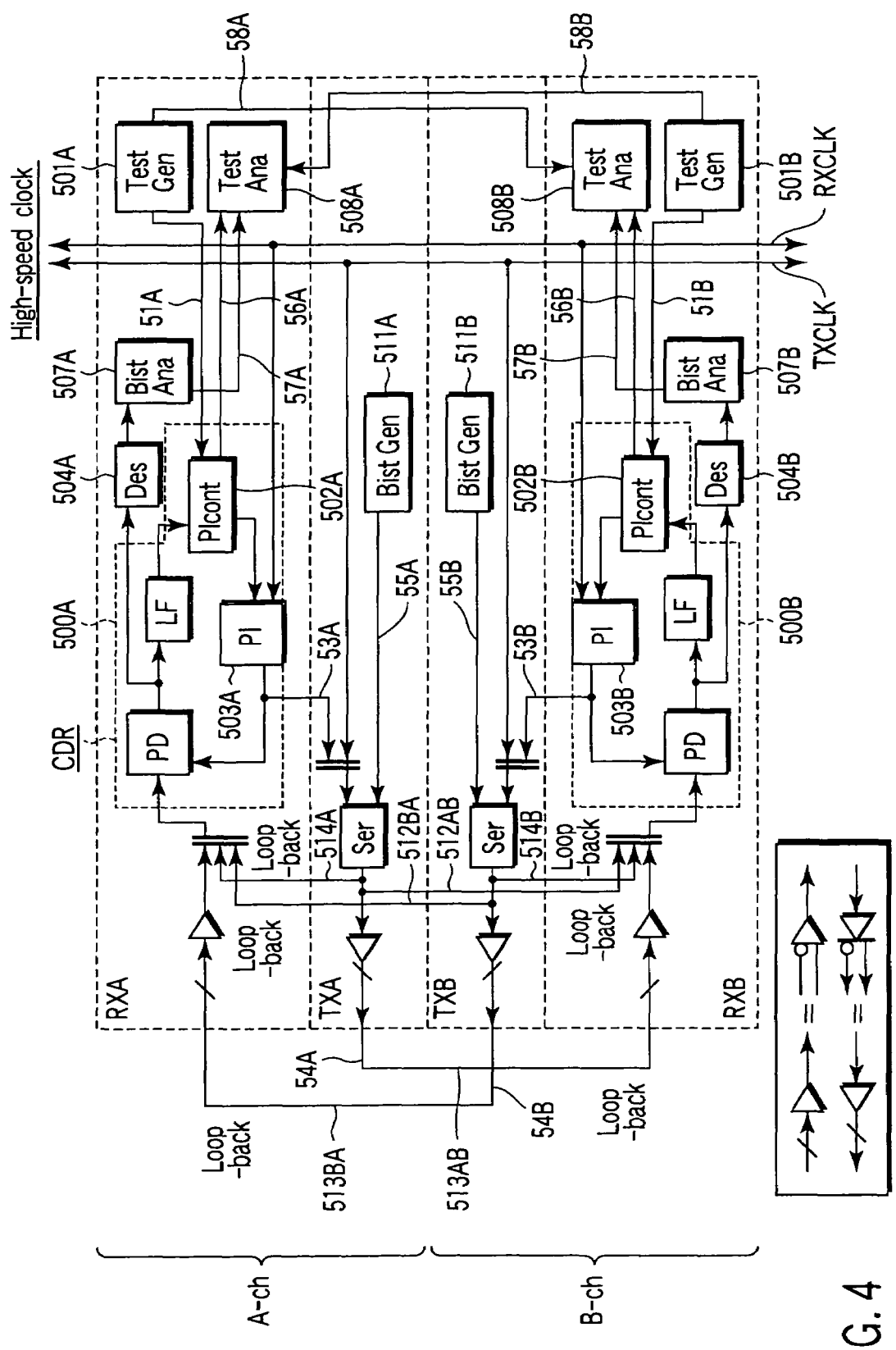
F I G. 4

Bit error rate testing

SEMICONDUCTOR INTEGRATED CIRCUIT DEVICE AND METHOD OF TESTING THE SAME

CROSS-REFERENCE TO RELATED APPLICATIONS

This application is based upon and claims the benefit of priority from the prior Japanese Patent Application No. 2003-308947, filed Sep. 1, 2003, the entire contents of which are incorporated herein by reference.

BACKGROUND OF THE INVENTION

1. Field of the Invention

The present invention relates to a semiconductor integrated circuit device and a method of testing the same and, more particularly, to a semiconductor integrated circuit device having a high-speed serial data interface and a method of testing the same.

2. Description of the Related Art

A high-speed serial data interface has a serial data transmitter TX and serial data receiver RX.

To test the transmitter TX of this high-speed serial data interface, it is only necessary to output data at low speed and check the pattern of the output data.

In contrast, to test the receiver RX, data must be input to the receiver RX at high speed. Unfortunately, a test apparatus which outputs data at high speed, e.g., a so-called "high-speed tester" which outputs data at a "Gbit/s" class bit transfer rate or higher is very expensive. The cost required to install this expensive high-speed tester is directly reflected in the fabrication cost of semiconductor integrated circuit devices. To provide users with inexpensive semiconductor integrated circuit devices, the fabrication cost must be lowered by performing tests by more inexpensive methods.

As one inexpensive test method, loop-back testing by which output data from the transmitter TX is looped back to the receiver RX is known. A semiconductor integrated circuit device for which this loop-back testing can be performed is described in, e.g., reference 1 (see FIG. 1, and the section on loop-back testing on page 13).

In the known loop-back testing method, as shown in FIG. 15, output data from the transmitter TX is looped back to the receiver RX. This allows the receiver RX to be tested without using an expensive high-speed tester.

Reference 1: Texas Instruments, "TLK2501 1.5 TO 2.5 GBPS TRANSCEIVER", [ONLINE] August 2000., [searched Aug. 25, 2003] Internet <hyperlink symbology omitted>

Unfortunately, the known loop-back testing method cannot raise the fault coverage of, in particular, a clock data recovery circuit (CDR).

The reason for this is as follows.

A CDR circuit includes a phase interpolator (PI). This PI is a circuit which, if offset (to be referred to as frequency offset hereinafter), is present between the frequency of a transmit data and the frequency of the clock in receiver, compensates a phase error produced by this frequency offset. If even a slight frequency offset is present, the PI activates itself and changes the phase of a clock to be generated. FIG. 16 shows the clock phase position diagram of a 16-phase clock switching type PI (clock 0→clock 1→clock 2→clock 3→clock 4→ . . . →clock 15). For example, when the phase is changed to clock 6, the phase is shifted by $3\pi/4$ (135°). FIG. 17 shows an example in which a phase error present between the clock in transmitter and the clock in receiver is compensated by shifting the phase to clock 1.

In the known loop-back testing method, however, the clock source of the transmitter TX is the same as that of the receiver RX. Since the same clock source is used, there is no frequency offset between the clocks. The PI cannot properly activate itself if there is no frequency offset. For example, the PI keeps locking itself to a certain point in the clock phase position diagram. Accordingly, testing concerning this PI remains unsatisfactory, so the fault coverage of the CDR circuit does not rise.

BRIEF SUMMARY OF THE INVENTION

A semiconductor integrated circuit device according to a first aspect of the present invention comprises: a first receiver including a first clock data recovery circuit capable of receiving serial data, recovering a clock from the received serial data, and changing a phase of a clock to be generated; a first transmitter including a first serializer which converts parallel data into serial data synchronized with one of a transmit clock and the clock generated by the first clock data recovery circuit; a second receiver including a second clock data recovery circuit capable of receiving serial data, recovering a clock from the received serial data, and changing a phase of a clock to be generated; and a second transmitter including a second serializer which converts parallel data into serial data synchronized with one of a transmit clock and the clock generated by the second clock data recovery circuit.

A semiconductor integrated circuit device according to a second aspect of the present invention comprises: a first receiver including a first clock data recovery circuit capable of receiving serial data, recovering a clock from the received serial data, and changing a phase of a clock to be generated on the basis of a frequency offset between the received serial data and a reference clock, or first phase control information for controlling a phase of a clock, and a first deserializer which converts serial data synchronized with the generated clock into parallel data; a first transmitter including a first serializer which converts parallel data into serial data synchronized with one of a transmit clock and the clock generated by the first clock data recovery circuit; a second receiver including a second clock data recovery circuit capable of receiving serial data, recovering a clock from the received serial data, and changing a phase of a clock to be generated on the basis of a frequency offset between the received serial data and a reference clock, or second phase control information for controlling a phase of a clock, and a second deserializer which converts serial data synchronized with the generated clock into parallel data; and a second transmitter including a second serializer which converts parallel data into serial data synchronized with one of a transmit clock and the clock generated by the second clock data recovery circuit.

A test method for a semiconductor integrated circuit device according to a third aspect of the present invention comprises: a first receiver including a first clock data recovery circuit capable of receiving serial data, recovering a clock from the received serial data, and changing a phase of a clock to be generated, a first transmitter including a first serializer which converts parallel data into serial data synchronized with one of a transmit clock and the clock generated by the first clock data recovery circuit, a second receiver including a second clock data recovery circuit capable of receiving serial data, recovering a clock from the received serial data, and changing a phase of a clock to be generated, and a second transmitter including a second serializer which converts parallel data into serial data synchronized with one of a transmit clock and the clock generated by the second clock data recovery circuit, comprising: when testing the first receiver, causing the second clock data recovery circuit to change a phase of a clock to be generated regardless of serial data, and output the phase-changed clock to the second transmitter; transmitting serial data synchronized with the phase-changed clock from the second transmitter to the first clock data recovery circuit; causing the first clock data recovery circuit to receive the serial data transmitted from the second transmitter, and recover the clock from the received serial data; and analyzing a state of the first clock data recovery circuit on the basis of phase control information of the clock changed by the second clock data recovery circuit, and phase control information when the first clock data recovery circuit recovers the clock, and when testing the second receiver, causing the first clock data recovery circuit to change a phase of a clock to be generated regardless of serial data, and output the phase-changed clock to the first transmitter; transmitting serial data synchronized with the phase-changed clock from the first transmitter to the second clock data recovery circuit; causing the second clock data recovery circuit to receive the serial data transmitted from the first transmitter, and recover the clock from the received serial data; and analyzing a state of the second clock data recovery circuit on the basis of phase control information of the clock changed by the first clock data recovery circuit, and phase control information when the second clock data recovery circuit recovers the clock.

BRIEF DESCRIPTION OF THE DRAWINGS

FIG. 4 is a block diagram showing the arrangement of a semiconductor integrated circuit device according to the second embodiment of the present invention;

DETAILED DESCRIPTION OF THE INVENTION

Figure 18:
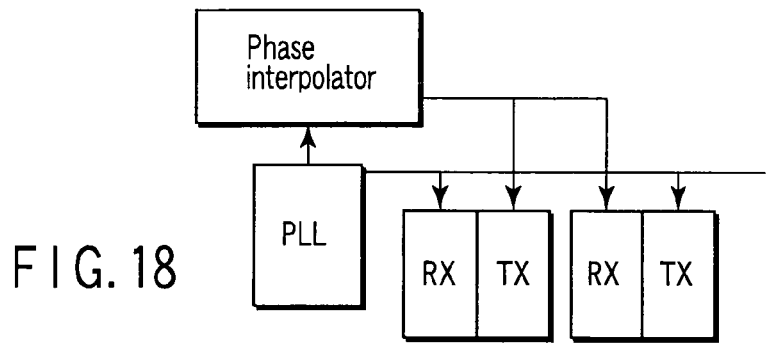
FIG. 18 is a block diagram showing a semiconductor integrated circuit according to a reference example of the present invention.

To increase the fault coverage of a CDR circuit, as shown in FIG. 18, it is possible to introduce a PI for testing in addition to a PI of a receiver (RX). A clock is supplied to the receiver RX directly from a clock source, e.g., a PLL circuit, and supplied to a transmitter TX from the PLL circuit via the PI. After the phase of the clock is shifted by the PI, the clock is supplied to the transmitter TX. This gives a frequency offset between the clock supplied to the transmitter TX and the clock supplied to the receiver RX.

Figure 19:
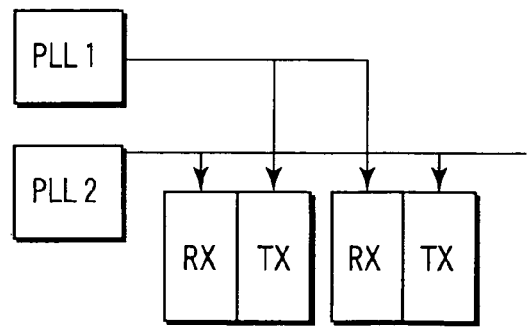
FIG. 19 is a block diagram showing a semiconductor integrated circuit according to a reference example of the present invention.

Alternatively, as shown in FIG. 19, a plurality of PLL circuits are used, and a clock is supplied to a transmitter TX from a PLL1 circuit and to a receiver RX from a PLL2 circuit. A frequency offset is given between the clock from the PLL1 circuit and the clock from the PLL2 circuit.

With these arrangements, it is possible to give a frequency offset and properly activate the PI. Since the PI can be properly activated, testing pertaining to this PI can be properly performed. However, installing a PI or PLL circuits only for testing unnecessarily increases the chip area.

Embodiments of the present invention will be described below with reference to the accompanying drawing. In the following explanation, the same reference numerals denote the same parts throughout the drawing.

First Embodiment

Figure 1:
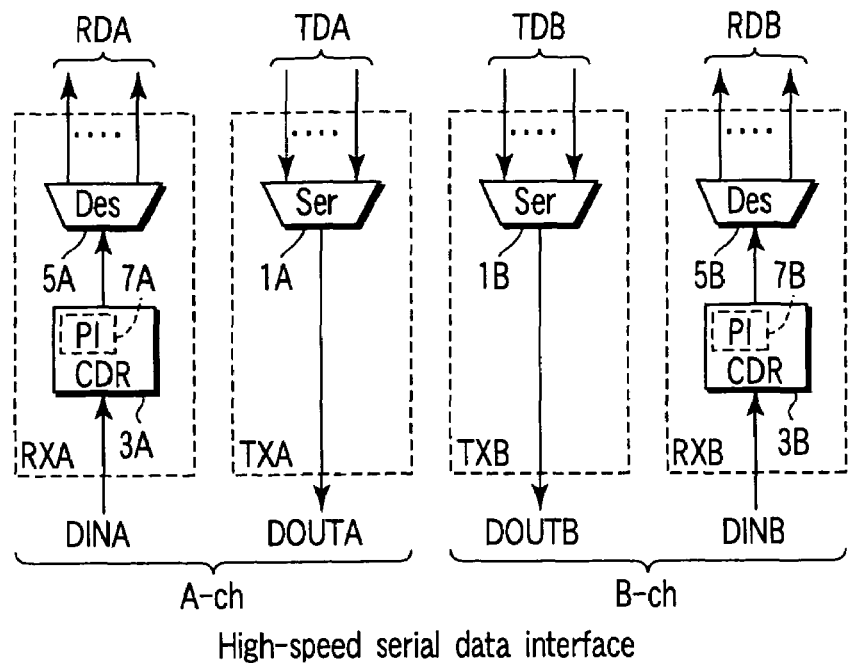
FIG. 1 is a block diagram showing the arrangement of a semiconductor integrated circuit device according to the first embodiment of the present invention.
Figure 2:
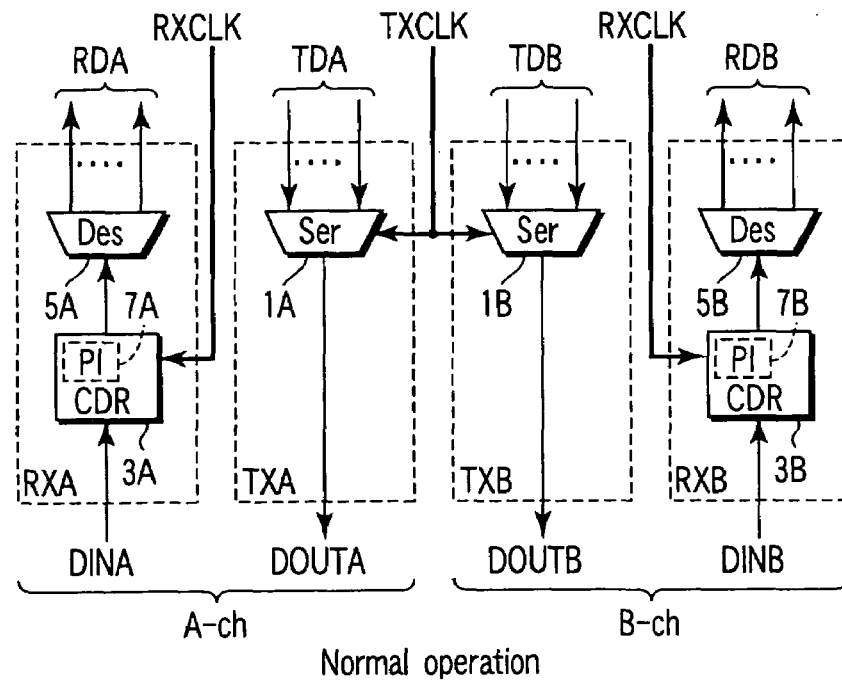
FIG. 2 is a block diagram showing the state of normal operation of the semiconductor integrated circuit device according to the first embodiment of the present invention.

FIG. 1 is a block diagram showing the arrangement of a semiconductor integrated circuit device according to the first embodiment of the present invention. FIG. 2 is a block diagram showing the state of normal operation.

As shown in FIG. 1, this semiconductor integrated circuit device has a high-speed serial data interface. An example of a semiconductor integrated circuit device having a high-speed serial data interface is a transceiver which transmits and receives data. The high-speed serial data interface of the transceiver according to this embodiment is a multi-channel interface having two channels or more. In this embodiment, the interface has a first channel A-ch and second channel B-ch. The first channel A-ch includes a first transmitter TXA and first receiver RXA. The second channel B-ch includes a second transmitter TXB and second receiver RXB.

The first transmitter TXA includes a first serializer (Ser) 1A, and the second transmitter TXB includes a second serializer (Ser) 1B. The first and second serializers 1A and 1B convert parallel data TDA and TDB output from the inside of the integrated circuit into serial data DOUTA and DOUTB, respectively, and output the data synchronized with a clock, e.g., a transmit clock TXCLK (FIG. 2). For example, the serializers 1A and 1B synchronize the serial data DOUTA and DOUTB with the transmit clock TXCLK.

The first receiver RXA includes a first clock data recovery circuit (CDR) 3A and first deserializer (Des) 5A. The second receiver RXB includes a second clock data recovery circuit (CDR) 3B and second deserializer (Des) 5B. The first and second CDR circuits 3A and 3B receive serial data DINA and DINB and extract information of synchronization with a receive clock RXCLK from the edges of the received serial data DINA and DINB, thereby recovering the clock. The receive clock RXCLK is synchronized with the transmit clock TXCLK. Therefore, no frequency offset is present, so the phase difference is always stable. The frequencies of the receive clock RXCLK and transmit clock TXCLK are sometimes the same and sometimes different. For example, the frequency of the transmit clock TXCLK is 1.25 GHz, and that of the receive clock RXCLK is 2.5 GHz. In this case, the transmit clock TXCLK is generated by, e.g., dividing the frequency of the receive clock RXCLK. The receive clock RXCLK functions as a reference clock for determining whether there is a frequency offset between the received serial data DINA, DINB and the receive clock RXCLK. If a frequency offset is present between the frequency of the receive clock RXCLK which thus functions as a reference clock and the frequency of the received serial data DINA and DINB, the phase error accumulates and expands with time difference unless it is compensated. Once the phase difference increases, it is no longer possible to receive the serial data. The first and second CDR circuits 3A and 3B compensate this phase error. To compensate the phase error, the first and second CDR circuits 3A and 3B have, e.g., first and second phase error interpolators (PIs) 7A and 7B. If a frequency offset is present, the first and second PIs 7A and 7B shift the phase and compensate the phase error. The first and second CDR circuits 3A and 3B output the received serial data DINA and DINB, or, if there is a phase error, output serial data DINA and DINB synchronized with a recovered clock generated by compensating the phase error. The first and second deserializers 5A and 5B convert the serial data DINA and DINB synchronized with the recovered clock into parallel data RDA and RDB, and output the data to the inside of the integrated circuit.

In the state of normal operation, the semi-conductor integrated circuit device according to the first embodiment operates as described above.

The state of operation of testing the receivers RXA and RXB will be explained next.

Figure 3:
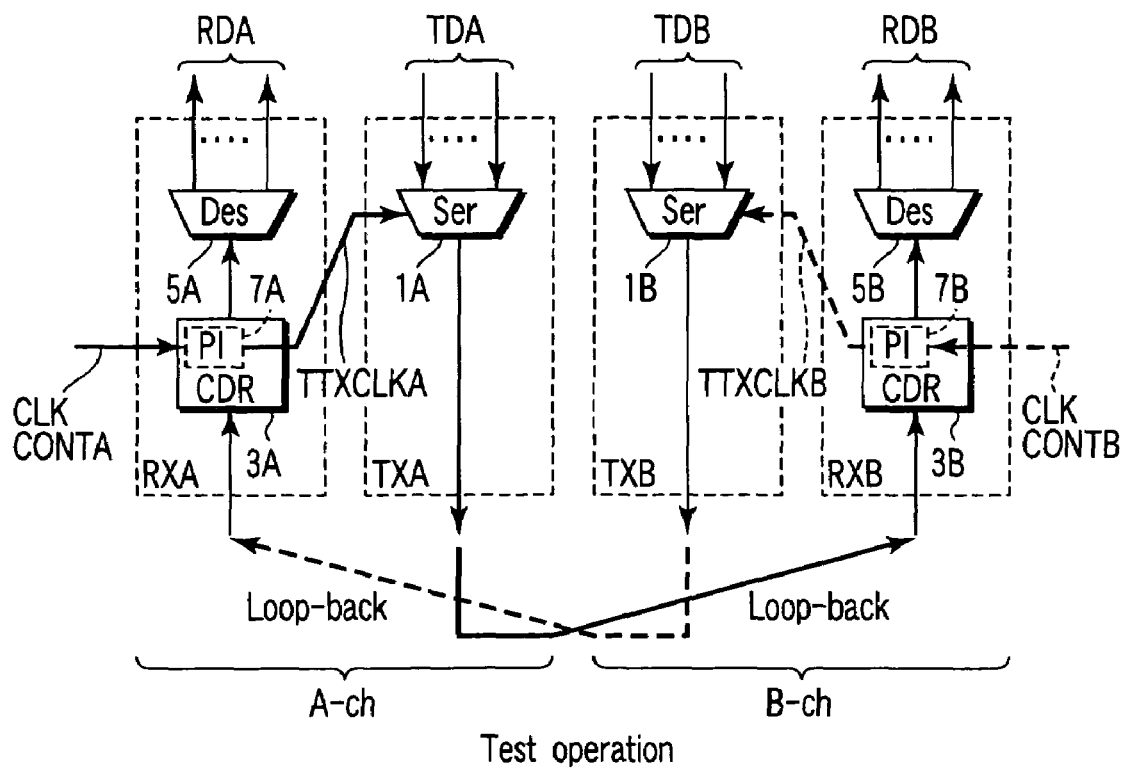
FIG. 3 is a block diagram showing the state of test operation of the semiconductor integrated circuit device according to the first embodiment of the present invention.

FIG. 3 is a block diagram showing the state of the test operation of the semiconductor integrated circuit device according to the first embodiment of the present invention.

If the receiver RXA of the first channel A-ch is to be tested in this test operation, as indicated by the dotted line in FIG. 3, output data from the transmitter TXB of the second channel B-ch is looped back to the receiver RXA.

In the normal operation state as shown in FIG. 2, the second serializer 1B outputs the serial data DOUTA synchronized with the transmit clock TXCLK. In the test operation, however, the second serializer 1B outputs serial data synchronized with a clock TTXCLKB generated by the second CDR circuit 3B of the second channel B-ch. The clock TTXCLKB is output from the second PI 7B.

In the normal operation state, as described previously, if a frequency offset is present between the frequency of the receive clock RXCLK and the received serial data DINB, the second PI 7B shifts the phase of the receive clock RXCLK. In the test operation state, however, the second PI 7B shifts the phase of the clock TTXCLKB on the basis of, e.g., clock control information CLKCONTB. This shift is performed the same number of times as the number of phases which can be switched by the first PI 7A. For example, when 16 phases are to be switched, the shift is performed 16 times. When the second PI 7B shifts the phase, the first PI 7A shifts the phase, too. Accordingly, whether the first PI 7A correctly operates can be tested at all phases which can be switched.

In contrast, when the receiver RXB of the second channel B-ch is to be tested, as indicated by the solid line in FIG. 3, output data from the transmitter TXA of the first channel A-ch is looped back to the receiver RXB.

In this test operation, the phase of the clock TTXCLKA is shifted by controlling the first PI 7A by clock control information CLKCONTA. For example, the phase is shifted 16 times. In this manner, whether the second PI 7B correctly operates can be tested at all phases which can be switched.

In the semiconductor integrated circuit device according to the first embodiment, the first and second PIs 7A and 7B have the function of forcedly controlling the phase of a clock on the basis of supplied information, e.g., the clock control information CLKCONTA and CLKCONTB, in addition to the function of shifting the phase of a clock if frequency offset is present.

Furthermore, the first and second serializers 1A and 1B have the function of outputting serial data synchronized with the clocks TTXCLKA and TTXCLKB generated by the first and second PIs 7A and 7B, in addition to the function of outputting serial data synchronized with the transmit clock TXCLK.

By using the above configuration, when the test operation is performed, the phase of serial data on the transmitting side is shifted by using the PI of the CDR circuit which is not tested. This serial data is looped back to the receiving side. Since the phase-shifted serial data is input to the receiving side, whether the PI of the CDR circuit to be tested correctly performs the phase shifting operation can be checked.

In this test operation, serial data is looped back from the transmitter TXA to the receiver RXB, and from the transmitter TXB to the receiver RXA. Therefore, the receivers RXA and RXB can be tested without using an expensive high-speed tester.

In addition, since the phase-shifted serial data can be input to the receives RXA and RXB, the CDR circuit, particularly, the PI of the CDR circuit can be operated in the all phase position (360°). This increases the fault coverage of the CDR circuit.

Furthermore, when the test operation is performed, the phase of serial data on the transmitting side is shifted by using the PI of the CDR circuit which is not tested. This makes it unnecessary to install any additional PI or PLL circuit only for the test. Accordingly, an increase in chip area can also be suppressed.

Second Embodiment

The second embodiment is a more definite example of the semiconductor integrated circuit device of the first embodiment.

In the second embodiment as this more definite example, new functional blocks for performing tests are added to the first embodiment. Examples of the added functional blocks and their configurations are as follows.

(A) Test Control Pattern Generating Circuit (TestGen)

A TestGen circuit generates phase control information necessary for a PI to shift the phase of a clock. For example, on the basis of information supplied from the outside of a high-speed serial data interface, the TestGen circuit outputs phase control information for shifting the phase of a clock to a CDR circuit.

(B) Test Analyzing Circuit (TestAna)

A TestAna circuit compares the phase shift amount of transmitted serial data with that of received serial data to check whether a CDR circuit has a problem.

(C) Loop-Back Path (Loop-back)

A loop-back path is an electrical path for looping output serial data from the transmitter back to the receiver. In this embodiment, serial data is looped back crosswise between adjacent channels. For example, serial data transmitted from a first channel A-ch is looped back to a second channel B-ch. On the other hand, serial data transmitted from the second channel B-ch is looped back to the first channel A-ch. This loop-back path need only be formed at least either outside or inside the semiconductor integrated circuit device chip. In this embodiment, the loop-back path is formed inside the semiconductor integrated circuit device chip. The advantage of the loop-back path formed inside the chip is that the semiconductor integrated circuit device can be tested without the device being connected to a testing substrate having a loop-back path. Therefore, the receiver can be tested in the form of a wafer. For example, a plurality of devices can be simultaneously tested in the form of a wafer. Since this shortens the time required for the test, it is possible to, e.g., improve the throughput and shorten the TAT (Turn Around Time) of the product.

Figure 5:
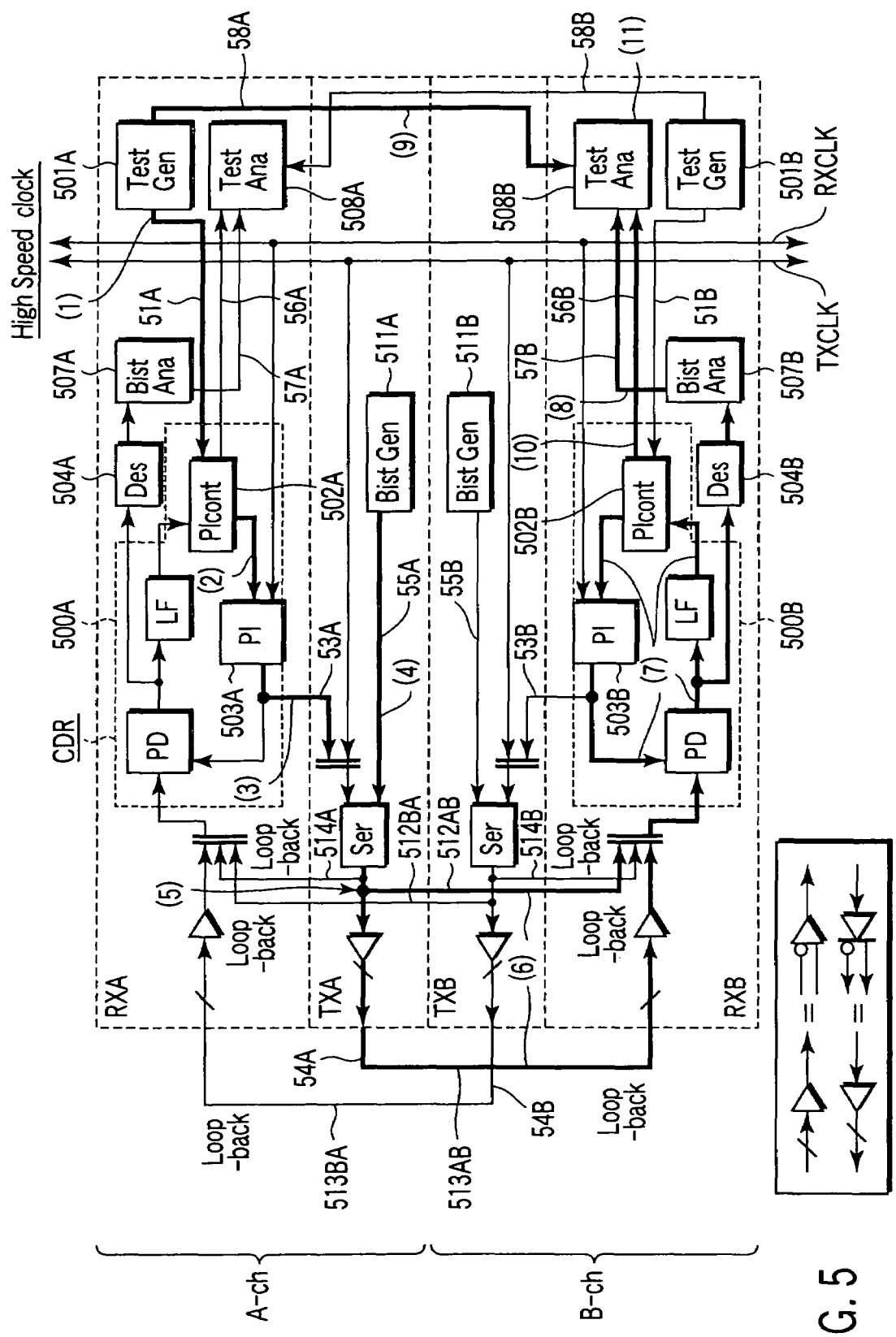
FIG. 5 is a block diagram showing the state of test operation of the semiconductor integrated circuit device according to the second embodiment of the present invention.

FIG. 4 is a block diagram showing the arrangement of the semiconductor integrated circuit device according to the second embodiment of the present invention. FIG. 5 is a block diagram showing the state of test operation.

The arrangement and its operation will be explained below.

In accordance with a phase shift in a CDR circuit of a receiver RXA, a CDR circuit of a receiver RXB shifts a recovered clock. The flow of the operation is as follows. In this embodiment, the receiver RXA shifts a high-speed clock, and a transmitter TXA outputs data synchronized with the shifted high-speed clock. The receiver RXB receives serial data looped back from the transmitter TXA to the receiver RXB, and uses the received serial data in its own test.

As shown in FIGS. 4 and 5, (1) A test control pattern generating circuit (TestGen) 501A transmits a clock control signal 51A to a PI control circuit (PIcont) 502A for controlling a PI 503A.

(2) On the basis of the clock control signal 51A, the PIcont circuit 502A controls the PI 503A to shift a high-speed clock 53A.

(3) The high-speed clock 53A is output to the transmitter TXA.

(4) In the transmitter TXA, a built-in self test pattern generating circuit (BISTGen) 511A generates a test data pattern 55A.

(5) The transmitter TXA converts the data 55A generated by the BISTGen circuit 511A into serial data 54A synchronized with the high-speed clock 53A, and outputs the serial data 54A.

(6) The receiver RXB receives the serial data looped back from the transmitter TXA, and recovers the clock on the basis of the received serial data 54A. Note that the serial data 54A is looped back by using one of a loop-back path 512AB formed inside the semiconductor integrated circuit device, and a loop-back path 513AB formed on the circuit board.

(7) The receiver RXB samples data synchronized with the recovered clock. The deserializer 504B converts serial data to parallel data.

(8) The received data is authenticated by a built-in self test analyzing circuit (BISTAna) 507B. The BISTAna circuit 507B outputs, e.g., bit error information 57B indicating the presence/absence of a bit error to a test analyzing circuit (TestAna) 508B.

(9) The TestGen circuit 501A outputs clock control information 58A to the TestAna circuit 508B.

(10) The PIcont circuit 502B outputs PI control information 56B to the TestAna circuit 508B.

(11) On the basis of the bit error information 57B, clock control information 58A, and PI control information 56B, the TestAna circuit 508B checks whether the receiver RXB has a problem.

For example, if a bit error is found by the analysis of the bit error information 57A, it is regarded that, e.g., "a CDR circuit 500B or a deserializer 504B has a problem". Also, if a large difference is found between the phase shift amounts by the analysis of the clock control information 58A and PI control information 56B, it is regarded that, e.g., "the CDR circuit 500B has a problem". In this explanation, PD, LF, and Ser stand for a phase detector, loop filter, and serializer, respectively, although their explanation is omitted.

It will be described how the clock output by the PI 503A of the CDR circuit 500A provided on the test data transmitting-side changes in phase. It will also be explained how the clock output by the PI 503B of the CDR circuit 500B provided on the test data receiving-side changes in phase. In this description, assume that the PIs 503A and 503B are 16-phase switching type PIs.

Figure 6:
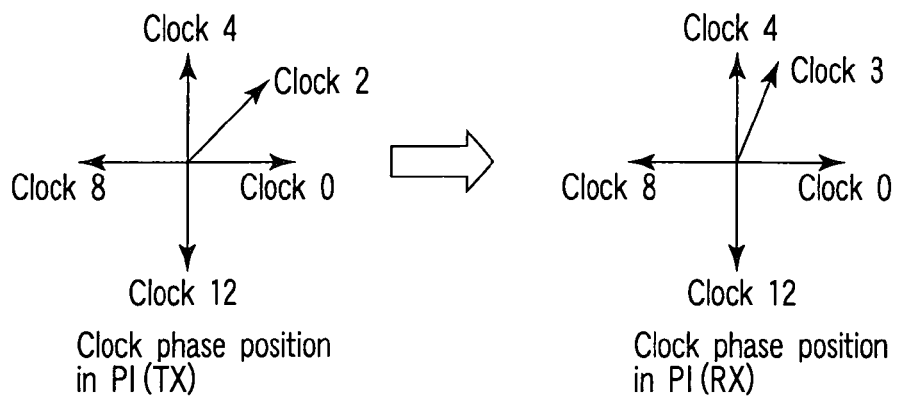
FIG. 6 is a view showing the phase states of PIs.

FIG. 6 shows the phase states of the PIs 503A and 503B before a high-speed clock is shifted. The left side of FIG. 6 indicates the phase of the transmitting-side PI 503A, and the right side of FIG. 6 indicates the phase of the receiving-side PI 503B. In this state shown in FIG. 6, the receiving-side PI 503B is synchronized with the high-speed clock 53A output from the transmitting-side PI 503A.

Figure 7:
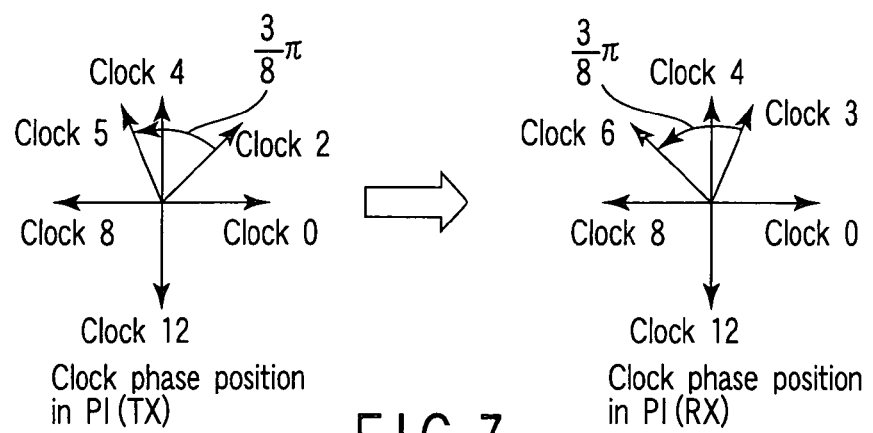
FIG. 7 is a view showing the phase states of the PIs.

FIG. 7 shows an example in which the phase of the high-speed clock 53A output from the transmitting-side PI 503A is shifted, e.g., delayed by $3\pi/8$ (67.5°) from the state shown in FIG. 6. When the phase of the high-speed clock 53A is thus delayed, the receiving-side PI 503B operates to synchronize with the high-speed clock 53A. As a consequence, the receiving-side PI 503B delays its phase following the high-speed clock 53A. If the receiving-side PI 503B is normally operating, as shown in FIG. 7, the receiving-side PI 503B delays its phase by $3\pi/8$ (67.5°) following the high-speed clock 53A.

Figure 8:
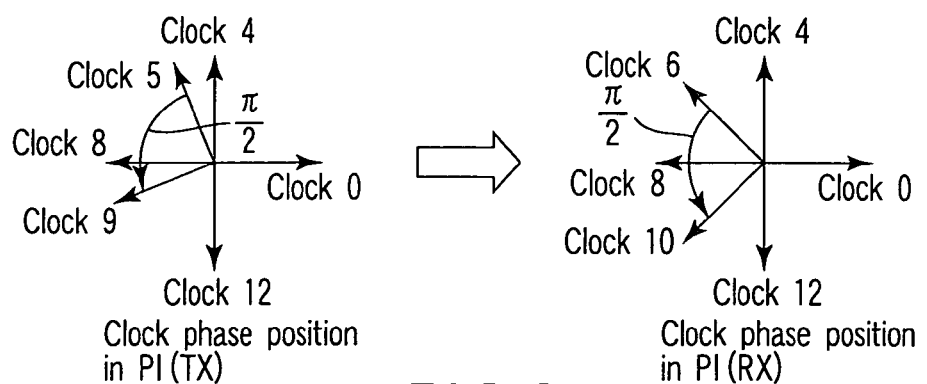
FIG. 8 is a view showing the phase states of the PIs.

FIG. 8 shows an example in which the phase of the high-speed clock 53A is further shifted, e.g., further delayed by $1\pi/2$ (90°) from the state shown in FIG. 7. If the receiving-side PI 503B is normally operating, the receiving-side PI 503B delays its phase by $1\pi/2$ (90°) following the high-speed clock 53A.

In this embodiment, the CDR circuits 500A and 500B are tested by using the properties described above. That is, the phase shift amount of transmitted serial data is compared with that of received serial data. For example, the TestAna circuit 508B can check the phase shift amount of the transmitting-side PI 503A from the clock control information 58A, and that of the receiving-side PI 503B from the PI control information 56B. The TestAna circuit 508B compares and analyzes the information 56B and 58A, e.g., compares and analyzes the values of the information 56B and 58A, thereby checking whether the phase of the receiving-side PI 503B follows that of the transmitting-side PI 503A. In short, "there is no problem" if the former phase follows the latter, and "there is a problem" if not. The TestAna circuit 508A of course also performs the same operation and determination as above.

Figure 9:
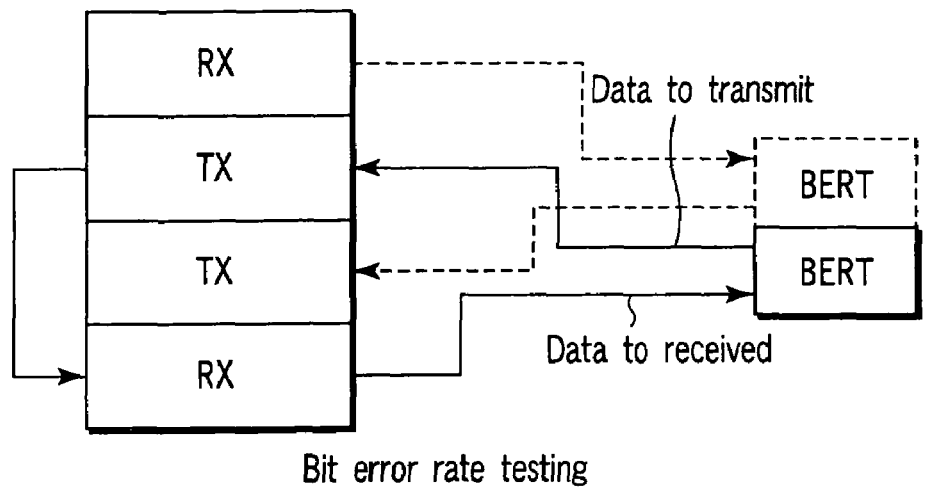
FIG. 9 is a view showing BERT (Bit Error Rate Testing)

During the test, it is also necessary to check whether actual data is correctly received. An example of this check method is to use a pseudo random bit stream (PRBS). To use this method, the BistGen circuit 511A of the transmitter TXA is given a PRBS data generator for generating PRBS data, and the BistAna circuit 507B of the receiver RXB is given a PRBS data analyzer having a generating polynomial corresponding to the PRBS data. With this arrangement, a test for checking whether data is correctly received can be performed. This test can be performed simultaneously with the CDR circuit test described above. To more carefully check whether data is correctly received, BERT (Bit Error Rate Testing) need only be given inside or outside the semiconductor integrated circuit device. As shown in FIG. 9, BERT checks whether transmitted data and received data are the same, and calculates the error occurrence frequency.

The second embodiment further provides the following implementation.

The second embodiment includes loop-back paths 512AB and 512BA for looping back data. In addition, the second embodiment includes loop-back paths 514A and 514B for looping back data. Although the loop-back paths 514A and 514B are not used in the test of the CDR circuit 500A and 500B described previously, the loop-back paths 514A and 514B can be used in the above-mentioned test for checking whether actual data is correctly received. For example, a test data pattern is generated by the BistGen circuit 511A, transmitted to the receiver RXA via the loop-back path 514A, and authenticated by the BistAna circuit 507A.

As described above, the semiconductor integrated circuit device further may include the loop-back paths 514A and 514B for looping back data in the same channel, in addition to the loop-back paths 512AB and 512BA for looping back data between different channels.

The loop-back paths 514A and 514B allow the semiconductor integrated circuit device to correspond to various tests. This makes it possible to obtain the advantage that, e.g., the flexibility concerning the test improves.

As described above, the same effects as in the first embodiment can be obtained in the second embodiment.

Third Embodiment

Figure 10:
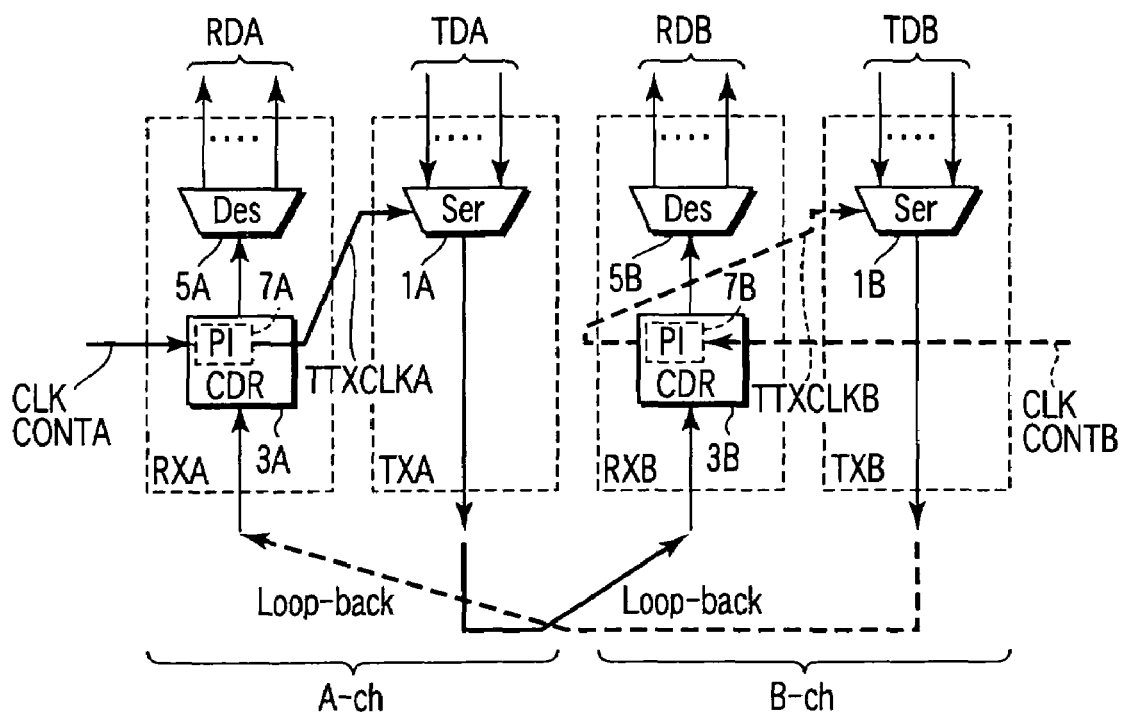
FIG. 10 is a block diagram showing the arrangement of a semiconductor integrated circuit device according to the third embodiment of the present invention.

FIG. 10 is a block diagram showing the arrangement of a semiconductor integrated circuit device according to the third embodiment of the present invention.

As shown in FIG. 10, the third embodiment differs from the first and second embodiments in that receivers RX and transmitters TX are alternately arranged in the order of a first receiver RXA, first transmitter TXA, second receiver RXB, and second transmitter TXB.

Unlike in the first and second embodiments, the circuit pattern of the first receiver RXA and first transmitter TXA (to be referred to as a first channel A-ch hereinafter) and the circuit pattern of the second transmitter TXB and second receiver RXB (to be referred to as a second channel B-ch) are not arranged into, e.g., a mirror image pattern. However, it is possible to test the receivers without using an expensive high-speed tester, and improve the fault coverage.

In the third embodiment, unlike in the first and second embodiments, the length of a loop-back path from the first channel A-ch to the second channel B-ch differs from that of a loop-back path from the second channel B-ch to the first channel A-ch. If this difference between the loop-back path lengths can have a certain influence on testing, the arrangement pattern of the first and second embodiments can be used. If the length difference has no influence on testing, the arrangement pattern of the third embodiment can be used.

Fourth Embodiment

Figure 11:
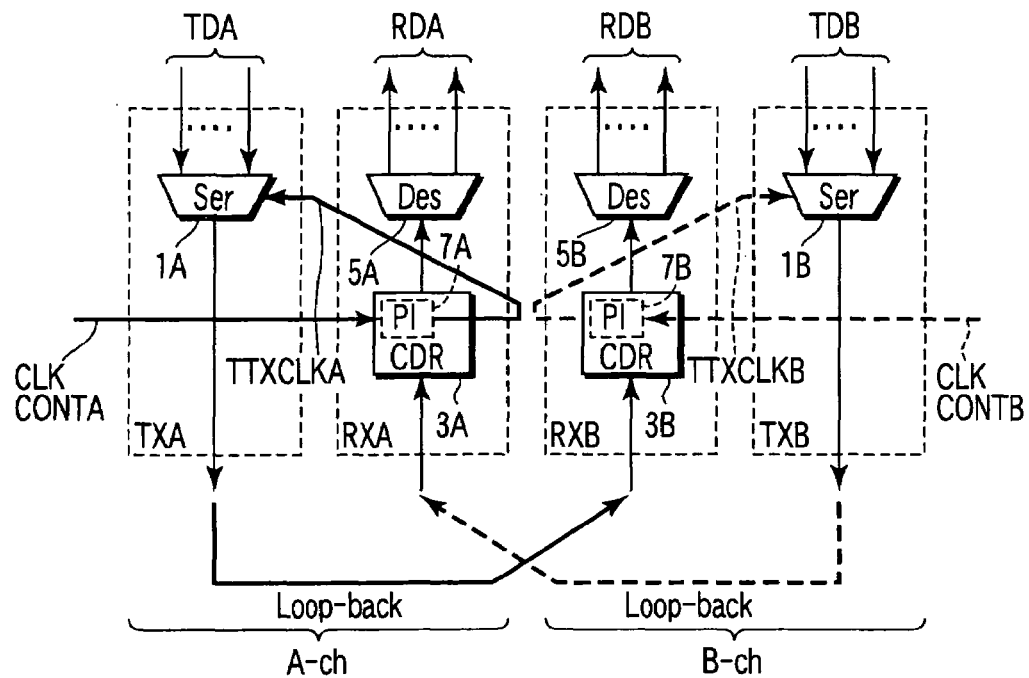
FIG. 11 is a block diagram showing the arrangement of a semiconductor integrated circuit device according to the fourth embodiment of the present invention.

FIG. 11 is a block diagram showing the arrangement of a semiconductor integrated circuit device according to the fourth embodiment of the present invention.

As shown in FIG. 11, the fourth embodiment differs from the first and second embodiments in that first and second receivers RXA and RXB are arranged between first and second transmitters TXA and TXB such that the first receiver RXA is adjacent to the first transmitter TXA, and the second receiver RXB is adjacent to the second transmitter TXB.

The same effects as in the first and second embodiments can be obtained without arranging the first and second transmitters TXA and TXB between the first and second receivers RXA and RXB as in the first and second embodiments.

Also, similar to the first and second embodiments, the fourth embodiment has the advantage that the length of a loop-back path from the first channel A-ch to the second channel B-ch is equal or almost equal to that of a loop-back path from the second channel B-ch to the first channel A-ch. As in the first and second embodiments, this decreases the possibility that the difference between the lengths of the loop-back paths has a certain influence on testing.

Fifth Embodiment

In the first to fourth embodiments, loop-back paths loop back data to connect different channels such that these loop-back paths are connected in the form of a so-called "cross couple connection" between the different channels.

In the fifth embodiment, clock lines for outputting clocks from receivers RX to transmitters TX are connected in the form of a cross couple connection between different channels.

Figure 12:
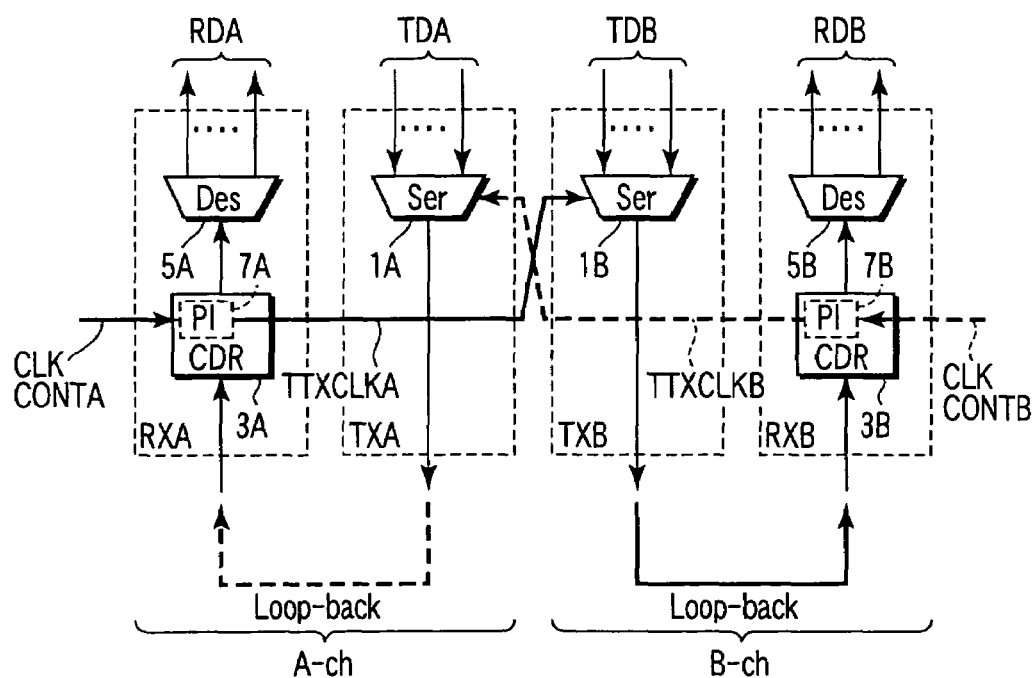
FIG. 12 is a block diagram showing the arrangement of a semiconductor integrated circuit device according to the fifth embodiment of the present invention.

FIG. 12 is a block diagram showing the arrangement of a semiconductor integrated circuit device according to the fifth embodiment of the present invention.

As shown in FIG. 12, the fifth embodiment differs from the first and second embodiments in that loop-back paths for looping back data are formed in individual channels, and, instead of these loop-back paths, clock lines for outputting clocks TTXCLKA and TTXCLKB are connected in the form of a cross couple connection between different channels.

Even when the lines for outputting the clocks TTXCLKA and TTXCLKB are connected in the form of a cross couple connection between different channels as described above, the receivers can be tested without using an expensive high-speed tester. In addition, the fault coverage can be improved.

In the fifth embodiment, however, the clock lines for outputting the clocks TTXCLKA and TTXCLKB are longer than those in the first to fourth embodiments because these clock lines must extend beyond the transmitters TXA and TXB. In contrast, the loop-back paths for looping back data are shorter than those in the first to fourth embodiments. Also, since loop-back paths for connecting different channels are unnecessary, the number of lines in the integrated circuit can be reduced.

Which of the loop-back paths or clock lines are to be connected in the form of a cross couple connection can be determined in accordance with which of the length of the loop-back paths or that of the clock lines has a larger influence on the test, or in accordance with which of the cross couple connection of the loop-back paths or that of the clock lines increases the space merit on the circuit pattern.

Sixth Embodiment

Figure 13:
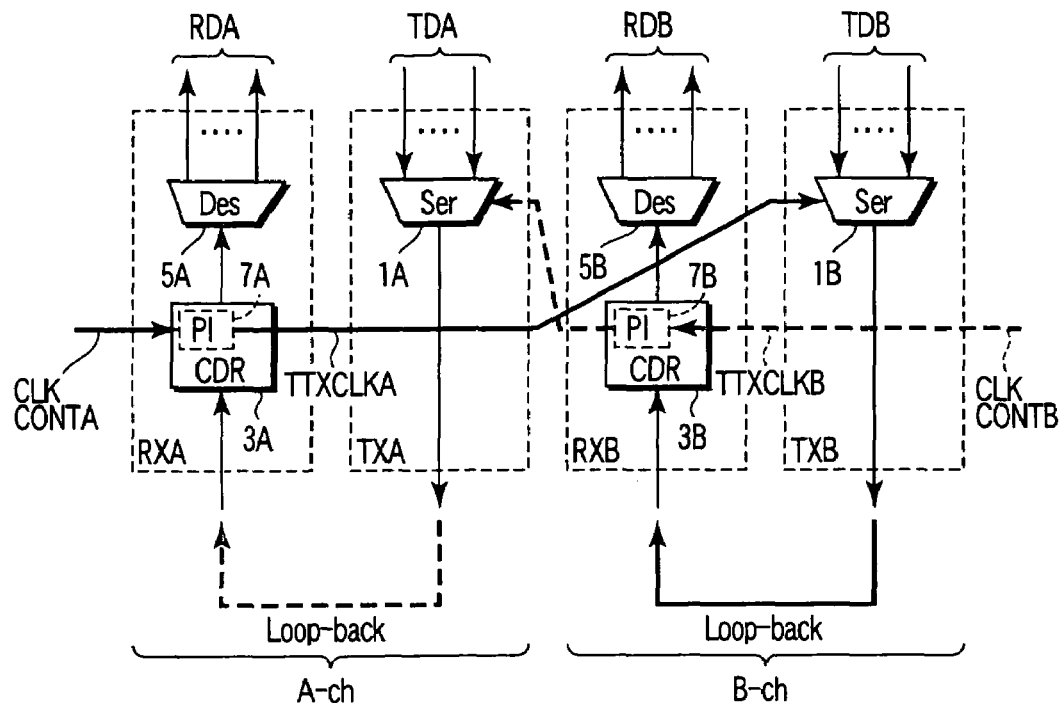
FIG. 13 is a block diagram showing the arrangement of a semiconductor integrated circuit device according to the sixth embodiment of the present invention.

FIG. 13 is a block diagram showing the arrangement of a semiconductor integrated circuit device according to the sixth embodiment of the present invention.

As shown in FIG. 13, the sixth embodiment differs from the fifth embodiment in that receivers and transmitters are arranged in the same manner as in the third embodiment shown in FIG. 10.

Even with this arrangement, the same effects as described above can be obtained.

Seventh Embodiment

Figure 14:
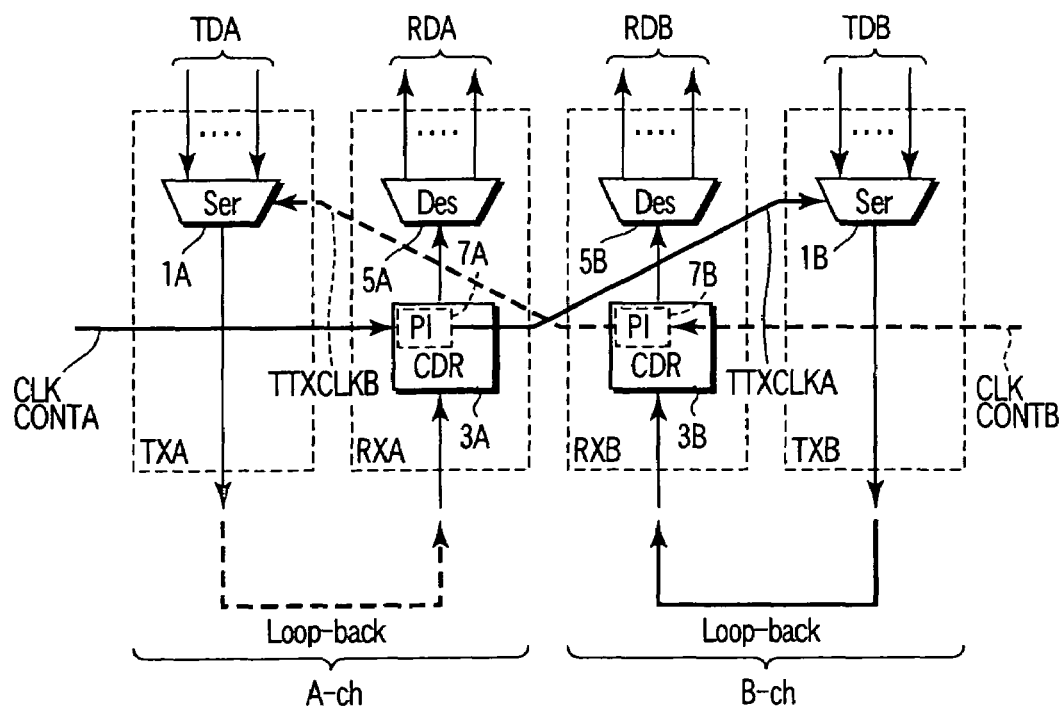
FIG. 14 is a block diagram showing the arrangement of a semiconductor integrated circuit device according to the seventh embodiment of the present invention.
Figure 15:
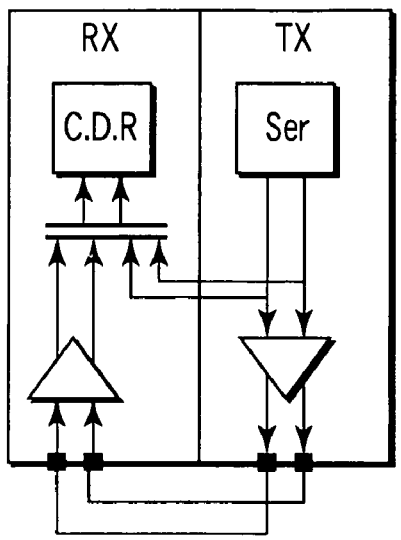
FIG. 15 is a block diagram showing a conventional semiconductor integrated circuit device.
Figure 16:
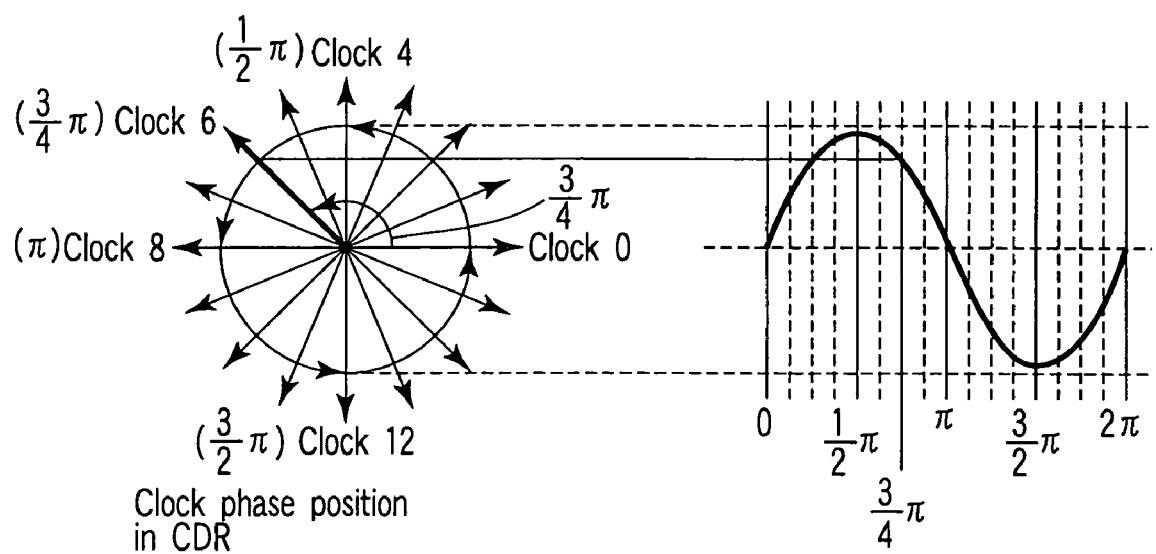
FIG. 16 is a view showing the clock phase position of a PI.
Figure 17:
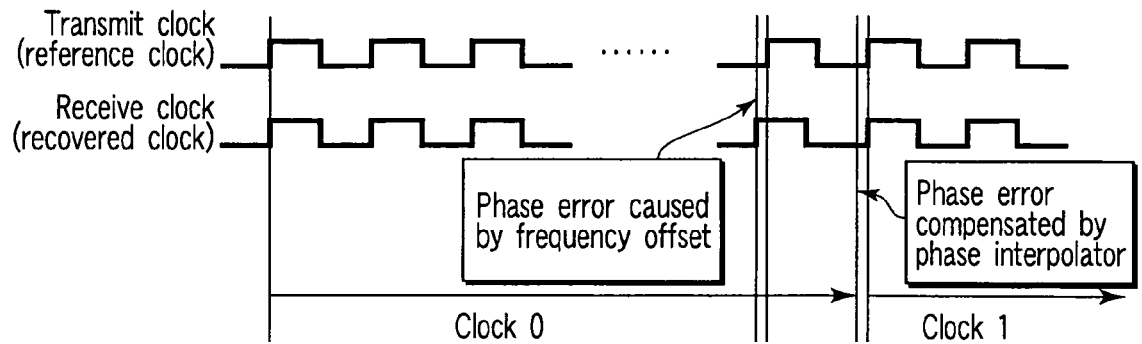
FIG. 17 is a view showing an example in which a phase error is compensated.

FIG. 14 is a block diagram showing the arrangement of a semiconductor integrated circuit device according to the seventh embodiment of the present invention.

As shown in FIG. 14, the seventh embodiment differs from the fifth embodiment in that receivers and transmitters are arranged in the same manner as in the fourth embodiment shown in FIG. 11.

Even with this arrangement, the same effects as described above can be obtained.

As has been described above, in the semiconductor integrated circuit device according to each embodiment of the present invention, receivers can be tested without using an expensive high-speed tester, and the fault coverage can be improved. In addition, these effects can be achieved while an increase in semiconductor integrated circuit device chip area is suppressed.

The present invention has been explained by the first to seventh embodiments. However, the present invention is not limited to these embodiments and can be variously modified when practiced without departing from the spirit and scope of the invention.

For example, the PI switches 16-phase clocks in each embodiment, but the number of phases to be switched is not limited to 16. That is, the phase error compensation accuracy can be increased when the number of phases to be switched is increased. Examples are 32-phase switching and 64-phase switching.

Also, in the second embodiment, the TestGen circuit and TestAna circuit are formed in each channel. However, these circuits may also be shared by different channels.

Although the above embodiments can be practiced singly, it is of course also possible to practice these embodiments in the form of an appropriate combination.

Furthermore, each embodiment includes inventions in various stages. Therefore, these inventions in various stages can be extracted by appropriately combining a plurality of constituent elements disclosed in each embodiment.

In addition, each embodiment is explained on the basis of an example in which the present invention is applied to a transceiver. However, the present invention also includes semiconductor integrated circuit devices incorporating the transceiver as described previously. Examples are a processor and system LSI.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor integrated circuit device comprising:
a first receiver including a first clock data recovery circuit capable of receiving serial data, recovering a clock from the received serial data, and changing a phase of a clock to be generated;
a first transmitter including a first serializer which converts parallel data into serial data synchronized with a transmit clock in a first test operation, and which converts the parallel data into the serial data synchronized with the clock modulated by the first clock data recovery circuit with an external phase control, independent of the received serial data in the first clock data recovery circuit in a second test operation;
a second receiver including a second clock data recovery circuit capable of receiving serial data, recovering a clock from the received serial data, and changing a phase of a clock to be generated;
a second transmitter including a second serializer which converts parallel data into serial data synchronized with a transmit clock in the second test operation, and which converts the parallel data into the serial data synchronized with the clock modulated by the second clock data recovery circuit with an external phase control, independent of the received serial data in the second clock data recovery circuit in the first test operation,
the first clock data recovery circuit being tested in the first test operation, the second clock data recovery circuit being tested in the second test operation.

2. The device according to claim 1, wherein
the first and second transmitters are arranged between the first and second receivers, and
the first and second transmitters are adjacent to the first and second receivers, respectively.

3. The device according to claim 1, wherein
the first and second receivers are arranged between the first and second transmitters, and
the first and second receivers are adjacent to the first and second transmitters, respectively.

4. The device according to claim 2, further comprising:
a first loop-back path which loops serial data from the first transmitter back to the second receiver; and
a second loop-back path which loops serial data from the second transmitter back to the first receiver,
wherein the first and second loop-back paths are formed in a semiconductor integrated circuit device chip.

5. The device according to claim 3, further comprising:
a first loop-back path which loops serial data from the first transmitter back to the second receiver; and
a second loop-back path which loops serial data from the second transmitter back to the first receiver,
wherein the first and second loop-back paths are formed in a semiconductor integrated circuit device chip.

6. The device according to claim 1, wherein
the first and second transmitters are arranged between the first and second receivers, and
the first and second transmitters are adjacent to the second and first receivers, respectively.

7. The device according to claim 1, wherein
the first and second receivers are arranged between the first and second transmitters, and
the first and second receivers are adjacent to the second and first transmitters respectively.

8. The device according to claim 4, further comprising:
a third loop-back path which loops serial data from the first transmitter back to the first receiver; and
a fourth loop-back path which loops serial data from the second transmitter back to the second receiver,
wherein the third and fourth loop-back paths are formed in the semiconductor integrated circuit device chip.

9. The device according to claim 5, further comprising:
a third loop-back path which loops serial data from the first transmitter back to the first receiver; and a fourth loop-back path which loops serial data from the second transmitter back to the second receiver,
wherein the third and fourth loop-back paths are formed in the semiconductor integrated circuit device chip.

10. The device according to claim 6, further comprising:
a third loop-back path which loops serial data from the first transmitter back to the first receiver; and
a fourth loop-back path which loops serial data from the second transmitter back to the second receiver,
wherein the third and fourth loop-back paths are formed in the semiconductor integrated circuit device chip.

11. The device according to claim 7, further comprising:
a third loop-back path which loops serial data from the first transmitter back to the first receiver; and
a fourth loop-back path which loops serial data from the second transmitter back to the second receiver,
wherein the third and fourth loop-back paths are formed in the semiconductor integrated circuit device chip.

12. A semiconductor integrated circuit device comprising:
a first receiver including a first clock data recovery circuit capable of receiving serial data, recovering a clock from the received serial data, and changing a phase of a clock to be generated on the basis of a frequency offset between the received serial data and a reference clock, or first phase control information for controlling a phase of a clock, and a first deserializer which converts serial data synchronized with the generated clock into parallel data; and
a first transmitter including a first serializer which converts parallel data into serial data synchronized with a transmit clock in a first test operation, and which converts the parallel data into the serial data synchronized with the clock generated by the first clock data recovery circuit in a second test operation;
a second receiver including a second clock data recovery circuit capable of receiving serial data, recovering a clock from the received serial data, and changing a phase of a clock to be generated on the basis of a frequency offset between the received serial data and a reference clock, or second phase control information for controlling a phase of a clock, and a second deserializer which converts serial data synchronized with the generated clock into parallel data; and
a second transmitter including a second serializer which converts parallel data into serial data synchronized with a transmit clock in the second test operation, and which converts the parallel data into the serial data synchronized with the clock generated by the second clock data recovery circuit in the first test operation;
wherein in the second test operation, the second receiver is tested,
the first clock data recovery circuit changes a phase of a clock to be generated on the basis of the first phase control information, and outputs the phase-changed clock to the first transmitter, the phase-changed clock being independent of the received serial data in the first clock data recovery circuit,
the first transmitter transmits, to the second clock data recovery circuit, serial data synchronized with the phase-changed clock output from the first clock data recovery circuit, and
the second clock data recovery circuit receives the serial data transmitted from the first transmitter, and recovers the clock from the received serial data; and
the first test operation, the first receiver is tested,
the second clock data recovery circuit changes a phase of a clock to be generated on the basis of the second phase control information, and outputs the phase-changed clock to the second transmitter, the phase-changed clock being independent of the received serial data in the second clock data recovery circuit,
the second transmitter transmits, to the first clock data recovery circuit, serial data synchronized with the phase-changed clock output from the second clock data recovery circuit, and
the first clock data recovery circuit receives the serial data transmitted from the second transmitter, and recovers the clock from the received serial data.

13. The device according to claim 12, further comprising:
a test control pattern generator; and
a test analyzer,
wherein the test control pattern generator generates the first and second phase control information, and
the test analyzer analyzes a state of the second clock data recovery circuit on the basis of the first phase control information and phase information of the clock recovered by the second clock data recovery circuit, and analyzes a state of the first clock data recovery circuit on the basis of the second phase control information and phase information of the clock recovered by the first clock data recovery circuit.

14. The device according to claim 13, wherein
the test control pattern generator comprises a first test control pattern generating circuit which generates the first phase control information, and a second test control pattern generating circuit which generates the second phase control information, and
the test analyzer comprises a first test analyzing circuit which analyzes the state of the first clock data recovery circuit, and a second test analyzing circuit which analyzes the state of the second clock data recovery circuit.

15. The device according to claim 12, wherein
the first and second transmitters are arranged between the first and second receivers, and
the first and second transmitters are adjacent to the first and second receivers, respectively.

16. The device according to claim 12, wherein
the first and second receivers are arranged between the first and second transmitters, and
the first and second receivers are adjacent to the first and second transmitters respectively.

17. The device according to claim 12, wherein
the first and second transmitters are arranged between the first and second receivers, and
the first and second transmitters are adjacent to the second and first receivers, respectively.

18. The device according to claim 12, wherein
the first and second receivers are arranged between the first and second transmitters, and
the first and second receivers are adjacent to the second and first transmitters, respectively.

19. A test method for a semiconductor integrated circuit device including
a first receiver including a first clock data recovery circuit capable of receiving serial data, recovering a clock from the received serial data, and changing a phase of a clock to be generated,
a first transmitter including a first serializer which converts parallel data into serial data synchronized with one of a transmit clock and the clock generated by the first clock data recovery circuit,
a second receiver including a second clock data recovery circuit capable of receiving serial data, recovering a clock from the received serial data, and changing a phase of a clock to be generated, and a second transmitter including a second serializer which converts parallel data into serial data synchronized with one of a transmit clock and the clock generated by the second clock data recovery circuit, the method comprising:

when testing the first receiver, causing the second clock data recovery circuit to change a phase of a clock to be generated regardless of serial data, and output the phase-changed clock to the second transmitter, the phase-changed clock being independent of the received serial data in the second clock data recovery circuit;

transmitting serial data synchronized with the phase-changed clock from the second transmitter to the first clock data recovery circuit;

causing the first clock data recovery circuit to receive the serial data transmitted from the second transmitter, and recover the clock from the received serial data; and analyzing a state of the first clock data recovery circuit on the basis of phase control information of the clock changed by the second clock data recovery circuit, and phase control information when the first clock data recovery circuit recovers the clock, and when testing the second receiver, causing the first clock data recovery circuit to change a phase of a clock to be generated regardless of serial data, and output the phase-changed clock to the first transmitter, the phase-changed clock being independent of the received serial data in the first clock data recovery circuit;

transmitting serial data synchronized with the phase-changed clock from the first transmitter to the second clock data recovery circuit;

causing the second clock data recovery circuit to receive the serial data transmitted from the first transmitter, and recover the clock from the received serial data; and analyzing a state of the second clock data recovery circuit on the basis of phase control information of the clock changed by the first clock data recovery circuit, and phase control information when the second clock data recovery circuit recovers the clock. the clock.

* * * * *